United States Patent [19]

Kile

[11] Patent Number: 5,122,075
[45] Date of Patent: Jun. 16, 1992

[54] ELECTRICAL CONNECTOR WITH IMPROVED RETENTION FEATURE

[75] Inventor: Richard A. Kile, Hummelstown, Pa.

[73] Assignee: AMP Incorporated, Harrisburg, Pa.

[21] Appl. No.: 701,929

[22] Filed: May 17, 1991

[51] Int. Cl.⁵ .......................................... H01R 13/62
[52] U.S. Cl. .................................. 439/329; 439/554; 439/751
[58] Field of Search ................. 439/62, 65, 78, 79, 439/82, 83, 751, 92, 547, 549, 554

[56] References Cited

U.S. PATENT DOCUMENTS

| | | | |
|---|---|---|---|
| 2,754,486 | 7/1956 | Hathorn | 339/17 |
| 2,814,024 | 11/1957 | Narozny | 339/193 |
| 2,893,006 | 7/1959 | Stuhre | 1/60 |
| 2,958,063 | 10/1960 | Stanwyck | 339/17 |
| 3,162,721 | 12/1964 | Rayburn | 174/68.5 |
| 3,486,224 | 12/1969 | Chaney | 29/626 |
| 3,524,108 | 8/1970 | English | 439/65 |
| 3,786,402 | 1/1974 | Horecky | 339/276 A |
| 3,865,459 | 2/1975 | Mills | 339/95 R |
| 3,975,076 | 8/1976 | Shida et al. | 339/17 L |
| 4,274,700 | 6/1981 | Keglewitsch et al. | 339/192 R |
| 4,353,609 | 10/1982 | Haas | 339/17 C |
| 4,377,321 | 3/1983 | Weisenburger | 339/220 R |
| 4,435,031 | 3/1984 | Black et al. | 339/17 C |
| 4,482,552 | 11/1984 | Clitherow | 424/246 |
| 4,609,242 | 9/1986 | Kemppainen | 439/78 |
| 4,704,790 | 11/1987 | Soth | 29/838 |
| 4,743,205 | 5/1988 | Mitani et al. | 439/78 |
| 4,793,816 | 12/1988 | Pittman et al. | 439/79 |
| 4,842,552 | 6/1989 | Frantz | 439/82 |
| 4,847,588 | 7/1989 | Doutrich | 439/82 |

FOREIGN PATENT DOCUMENTS

| | | |
|---|---|---|
| 1490236 | 10/1969 | Fed. Rep. of Germany . |
| 1816073 | 7/1970 | Fed. Rep. of Germany . |
| 40-22823 | 8/1965 | Japan . |
| 50-115977 | 9/1975 | Japan . |
| 52-43838 | 10/1977 | Japan . |
| 52-161454 | 12/1977 | Japan . |
| 55-17386 | 2/1980 | Japan . |
| 55-47788 | 3/1980 | Japan . |
| 55-21483 | 5/1980 | Japan . |
| 56-72485 | 6/1981 | Japan . |
| 57-80087 | 5/1982 | Japan . |
| 57-82076 | 5/1982 | Japan . |
| 57-86270 | 5/1982 | Japan . |
| 57-122677 | 7/1982 | Japan . |
| 57-155663 | 9/1982 | Japan . |
| 57-167574 | 10/1982 | Japan . |
| 57-178377 | 11/1982 | Japan . |
| 58-131571 | 9/1983 | Japan . |
| 58-142863 | 9/1983 | Japan . |
| 58-165980 | 11/1983 | Japan . |
| 59-61484 | 4/1984 | Japan . |
| 60-41647 | 12/1985 | Japan . |
| 60-164342 | 12/1985 | Japan . |

*Primary Examiner*—David L. Pirlot
*Attorney, Agent, or Firm*—David L. Smith

[57] ABSTRACT

An electrical connector includes a connector body and an array of posts extending out of one side of the connector body for mounting to a circuit board. At least one retention feature is provided, and this retention feature includes a bent portion of at least one of the posts. The bent portion includes a first portion extending from the centerline of the post to an apex, and a second portion extending from the apex to the tip such that the apex is laterally offset from the centerline to a greater extent than is the tip. At least the first and second portions are formed of post stock having four faces that intersect at radiused edges, wherein each of the radiused edges defines a radius of curvature no less than about 0.005 inches. The retention feature is configured such that the apex is situated outside of the respective through hole when the electrical connector is positioned on a circuit board, and the first portion contacts the circuit board at the respective corner between the through hole and the surface of the circuit board opposite the connector body.

24 Claims, 4 Drawing Sheets

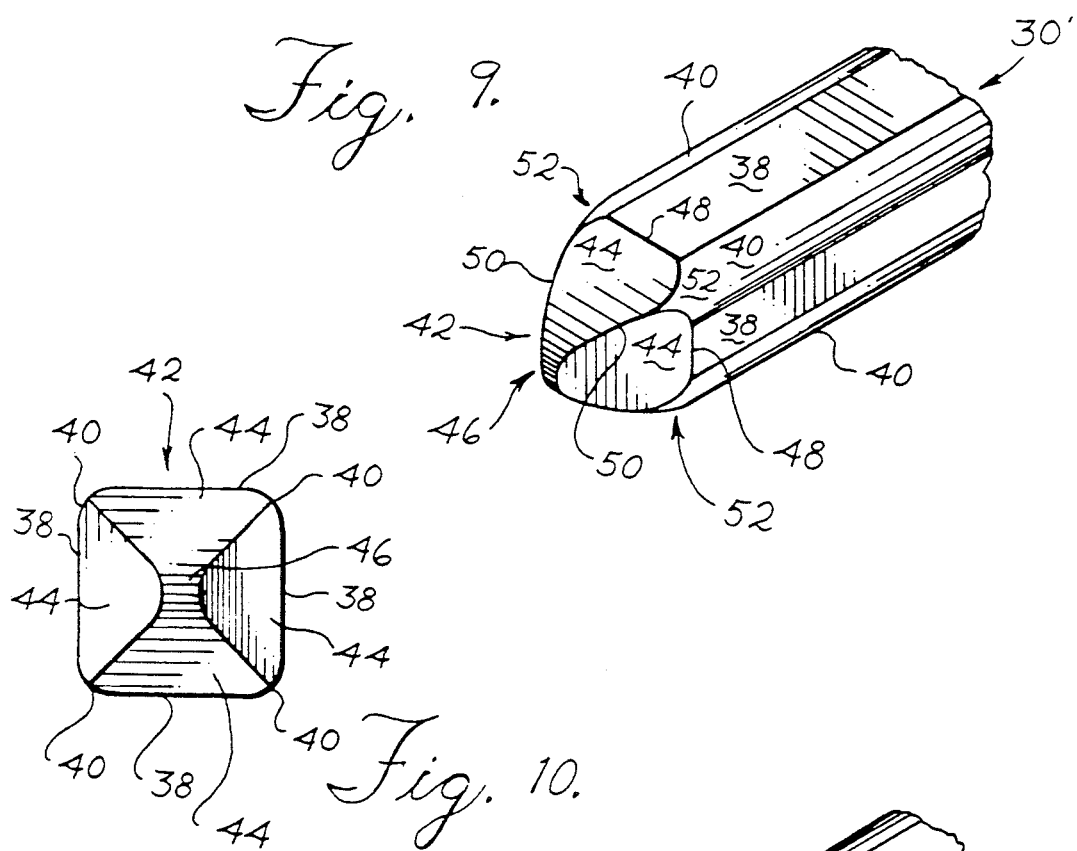
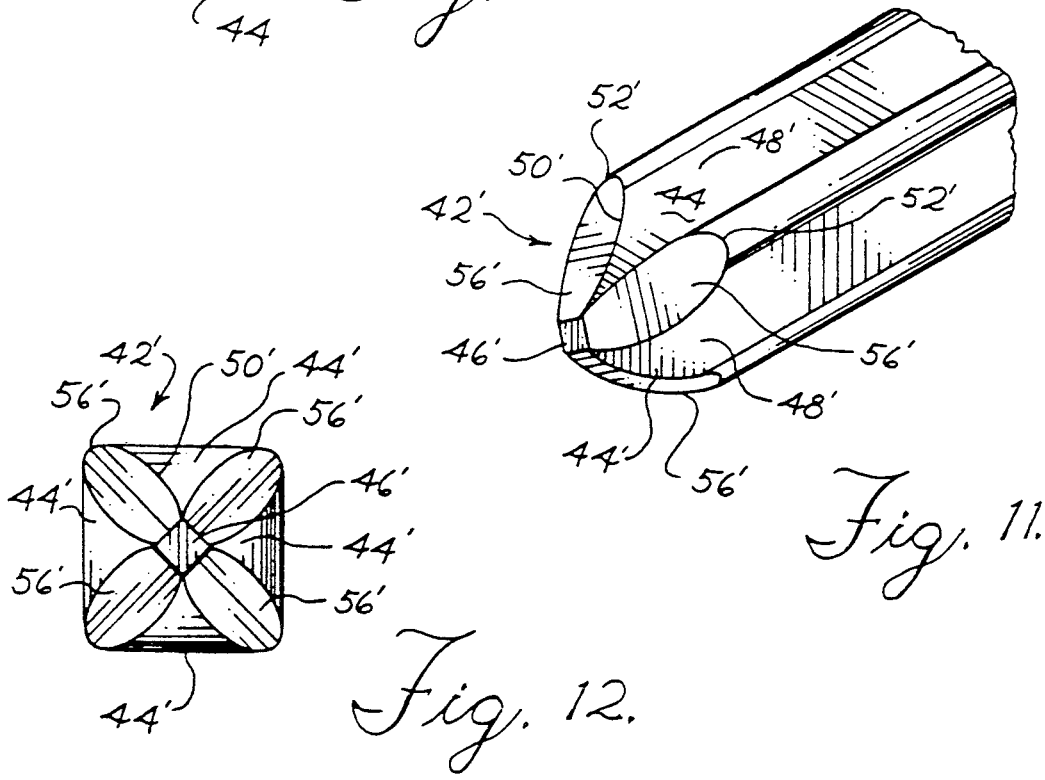

ELECTRICAL CONNECTOR WITH IMPROVED RETENTION FEATURE

BACKGROUND OF THE INVENTION

This invention relates to electrical connectors of the type having a connector body and a plurality of posts extending out of one side of the connector body for mounting to a circuit board. In particular, this invention relates to an improved retention feature for such electrical connectors for temporarily holding the electrical connector in place on a printed circuit board prior to soldering.

U.S. Pat. No. 4,847,588 discloses an electrical connector with a retention feature in which the posts of the connector are offset in the form of a crimp to create frictional forces against the side wall of the through hole of the circuit board onto which the electrical connector is mounted. The disclosed retention feature relies entirely on friction, and does not provide any latching force tending to secure the electrical connector in position on the circuit board.

In another type of retention feature for electrical connectors individual pins of the connector are formed to create a latching force against the bottom surface of the circuit board on which the electrical connector is mounted. See for example U.S. Pat. No. 3,524,108 and Japanese UM Publication No. 57-86270. Such below the board retention features can provide an audible click when the connector is seated on the circuit board, and some users regard below the board retention features as more stable.

When below the board retention features are applied to relatively stiff posts such as posts having a cross sectional dimension of 0.025 by 0.025 inches, problems have been encountered. These problems relate to the fact that the through hole geometry of the circuit board varies within a range of tolerances, and the retention feature must function properly throughout this range. In a below the board retention feature the corners of the post latch against the corner of the through hole. In the past, there has been a tendency with relatively thick and inflexible posts for the retention feature to damage the tin plating of the through hole at the corner of engagement with the post, at least when the through hole is near one edge of the tolerance range. This problem has in the past limited the use of below the board retention features with stiff posts.

SUMMARY OF THE INVENTION

According to this invention, at least one retention feature is formed on a selected one of the posts of an electrical connector of the type described above. This retention feature comprises a bent portion of the post comprising a first portion extending from the centerline of the post to an apex, and a second portion extending from the apex to the tip, such that the apex is laterally offset from the centerline to a greater extent than is the tip. The post defines two opposed flat faces, and the second portion defines at least one contacting surface positioned to contact the circuit board at the respective corner between the through hole and the surface adjacent the connector body as the post is inserted into the respective through hole. This contacting surface defines a radius of curvature no less than about one fifth of the maximum face to face cross-sectional dimension of the post.

It has been surprisingly discovered that the radiused contacting surface cooperates with the bent portions of the post to provide a below the board retention feature which functions well with a wide range of through hole geometries and without excessive damage to tin plating on the through hole. With this invention, the advantages of below the board retention can be obtained, even with thick and inflexible posts of the type described below.

BRIEF DESCRIPTION OF THE DRAWINGS

FIG. 9 is a perspective view of the tip geometry of one of the pins of FIGS. 5 and 7;

FIG. 10 is an end view of the tip of the FIG. 9;

FIG. 11 is a perspective view of an alternate tip geometry suitable for use with the connector of FIG. 1;

FIG. 12 is an end view of the tip of FIG. 11;

DETAILED DESCRIPTION OF THE PREFERRED EMBODIMENTS

Figure 1:
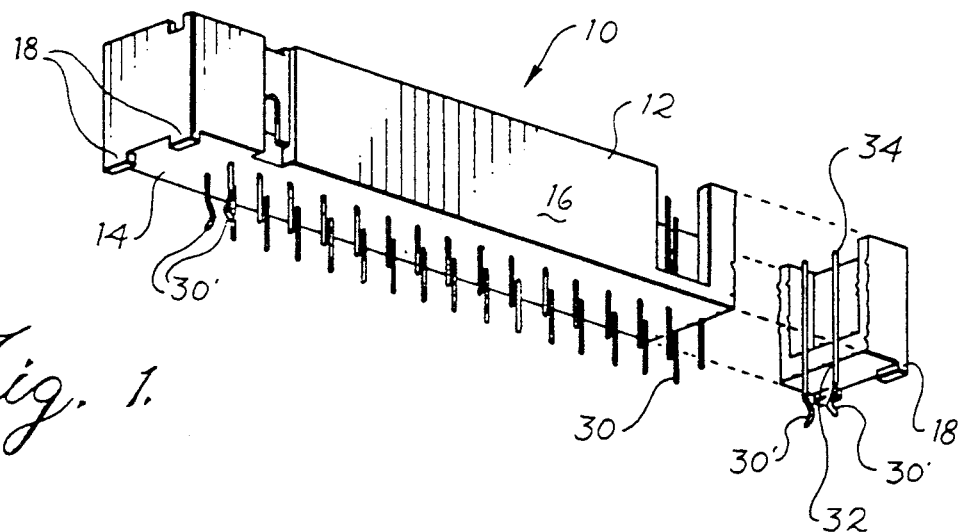
FIG. 1 is a perspective view of a shrouded header assembly which incorporates a presently preferred embodiment of this invention.

Turning now to the drawings, FIG. 1 shows a general view of an electrical connector 10 which incorporates a presently preferred embodiment of this invention. The electrical connector 10 as shown is a header which comprises a connector body 12 molded of a suitable plastic material. The body 12 includes a base 14 and integrally molded side walls 16 and standoffs 18. Rows of through holes are preformed in the base 14 during the molding operation.

Figure 2:
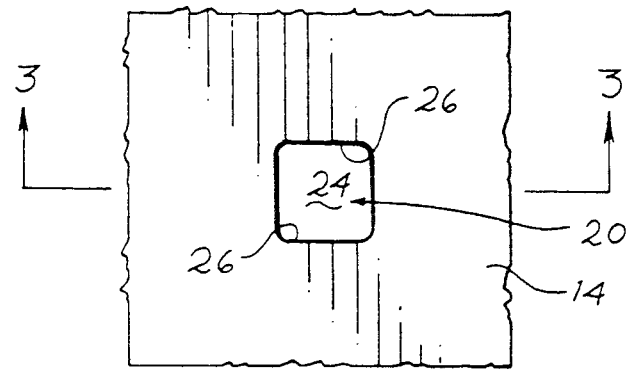
FIG. 2 is a top view of one of the through holes formed in the connector body of FIG. 1.
Figure 3:
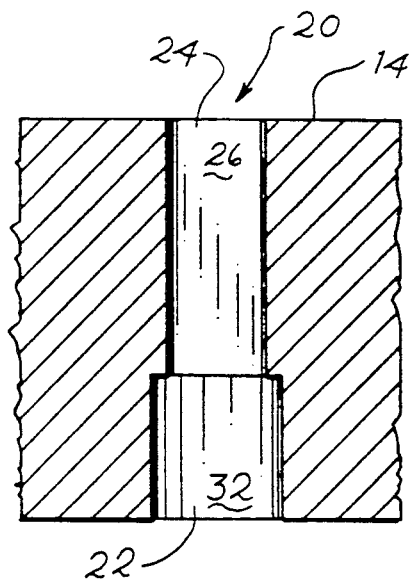
FIG. 3 is a cross sectional view taken along line 3—3 of FIG. 2.

FIGS. 2 and 3 show further details of one of the through holes 20 of the base 14, which includes a round portion 22 and an out-of-round portion 24 that includes two pairs of opposed faces 26. Preferably, each through hole 20 is formed with a single core pin that forms both the round portion 22 and the out-of-round portion 24, thereby eliminating any internal mating lines (and possible misalignment) within the through hole 20.

As shown in FIG. 1, the electrical connector 10 also includes an array of posts 30, 30'. Each of the posts 30, 30' defines a first end 32 and an opposed second end 34. The first ends 32 are adapted to be inserted into through holes of a printed circuit board while the second ends 34 are adapted to mate with a mating connector (not shown). In the connector 10, the four corner posts 30' are provided with a retention feature as described below.

Figure 6:
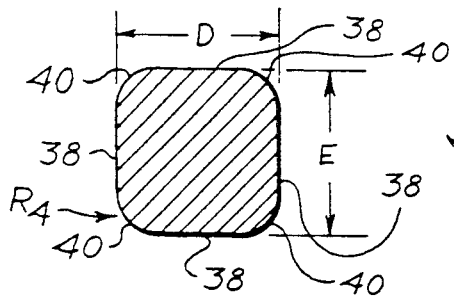
FIG. 6 is a cross-sectional view taken along line 6—6 of FIG. 4.
Figure 4:
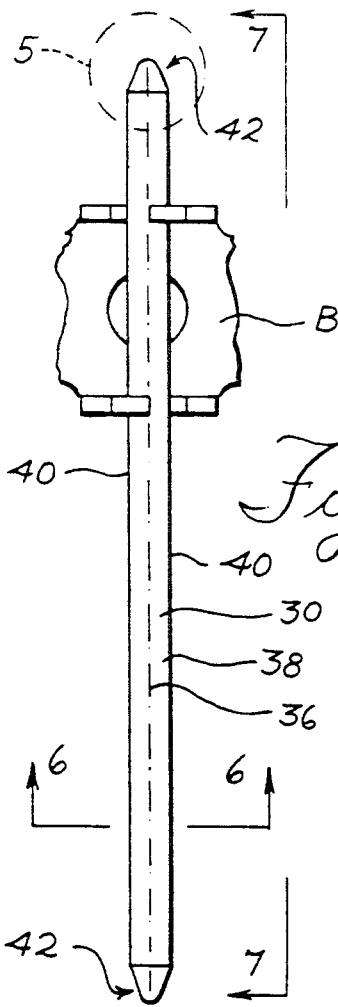
FIG. 4 is a front view of one of the posts of the connector of FIG. 1, mounted in a bandolier prior to insertion into the connector.
Figure 7:
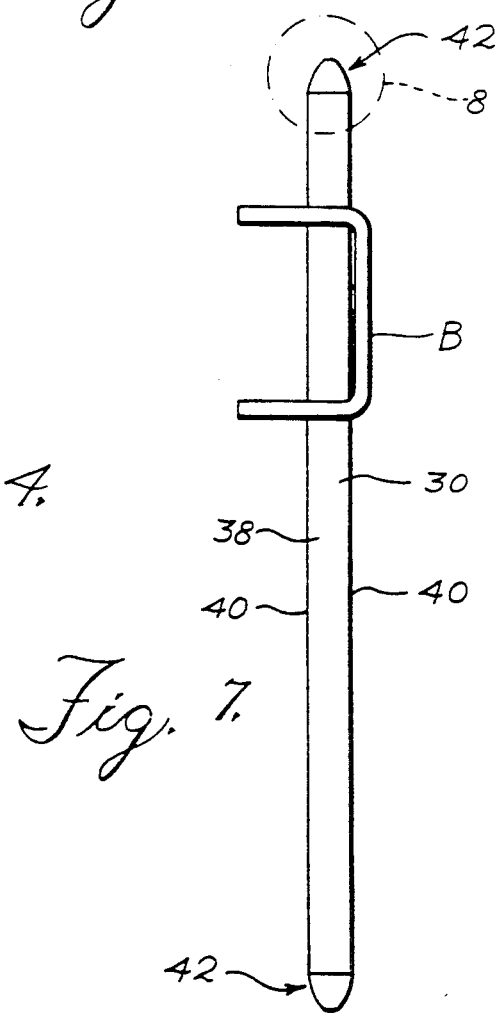
FIG. 7 is a side view taken along line 7—7 of FIG. 4.

As shown in FIGS. 4, 6 and 7, each of the posts 30 defines a cross-section which comprises two pairs of opposed post faces 38 that intersect at post edges 40 extending parallel to the centerline 36. As shown in FIG. 6, each of the post edges 40 is curved with a radius of curvature which is at least about one fifth of the maximum face to face dimension. In this particular embodiment, the maximum face to face dimension is about 0.025 inches and the radius of curvature is at least about 0.005 inches. FIGS. 4 and 7 show one of the posts 30 mounted in a bandolier B which is used to position and retain the posts 30 for forming, plating and press fit operations in the conventional manner.

Each end of the posts 30, 30' defines a tip 42 which is shaped to provide the advantages described above. The features of the tip 42 described below facilitate insertion of the tip 42 into the through hole 20 and provide improved mating between the mating end and the socket of a mating connector (not shown).

In particular, as shown in FIGS. 5, 8, 9 and 10, each tip 42 defines four converging tip faces 44 which converge from the body of the post 30 toward a nose 46. The nose 46 may be flat or radiused as desired. In this embodiment each of the tip faces 44 is shaped as a section of a cylinder and is convex outwardly with a radius of curvature that is preferably greater than the maximum face to face dimension of the post 30. Each of the tip faces 44 is aligned with a respective one of the post faces 38 and is joined thereto at a tip-to-body edge 48. Because of the convexity of the tip faces 44, there is a smooth transition between each of the tip faces 44 and the aligned post face 38.

As best shown in FIGS. 9 and 10, adjacent ones of the tip faces 44 intersect at tip edges 50 which are convex outwardly and which intersect the radiused post edges 40 at tip-to-body corners 52. In this regard, the convexly shaped tip edges 50 cooperate with the radiused post edges 40 to provide a smooth transition and to substantially eliminate protruding corners that might tend to skive the through hole 20 of the body 12 during assembly.

Turning now to FIGS. 10 and 11, an alternate geometry for the tip 42' includes tip faces 44' substantially as described above which meet at a nose 46'. In this alternate embodiment intermediate surfaces 56' are provided which taper toward the nose 46'. Each of the intermediate surfaces 56' is interposed between two adjacent tip faces 44' such that the intermediate surfaces 56' are rotated by 45 degrees with respect to the tip faces 44'. In this embodiment the tip edges 50' curve inwardly toward the tip faces 44'.

The intermediate surfaces 56' provide a number of advantages. First, they reduce the prominence of the tip-to-body corners 52', thereby reducing skiving problems as described below. Furthermore, because the tip edges 50' curve inwardly toward the tip faces 44', debris tends to be wiped away to the outside of the tip 42' during mating. Furthermore, the shape of the tip faces 44' allows high pressure cleaning of a mating receptacle during mating. In alternative embodiments the tip faces 44' and the intermediate surfaces 56' may be all convex, all planar, or some may be convex and some planar.

In order to assemble the electrical connector 10 the posts 30 are press fit into the through holes 20 of the body 12, by passing the tips 42, 42' through the through holes 20 in a conventional press-fit operation. The tip geometries 42, 42' described above provide advantages during the press-fit operation. Because the tip-to-body corners 52, 52' and the tip-to-body edges 48, 48' are relieved, there is a reduced tendency for the tips 42, 42' to skive plastic out of the body 12 as the tips 42, 42' pass through the through hole 20. Because of the cooperation between the shape of the posts 30 and the shape of the through holes 20, maximum stresses on the body 12 around the through holes 20 are reduced, and maximum insertion forces are reduced as well. Furthermore, because the mating end 54 is shaped as described above, mating forces are reduced as well.

Figure 13:
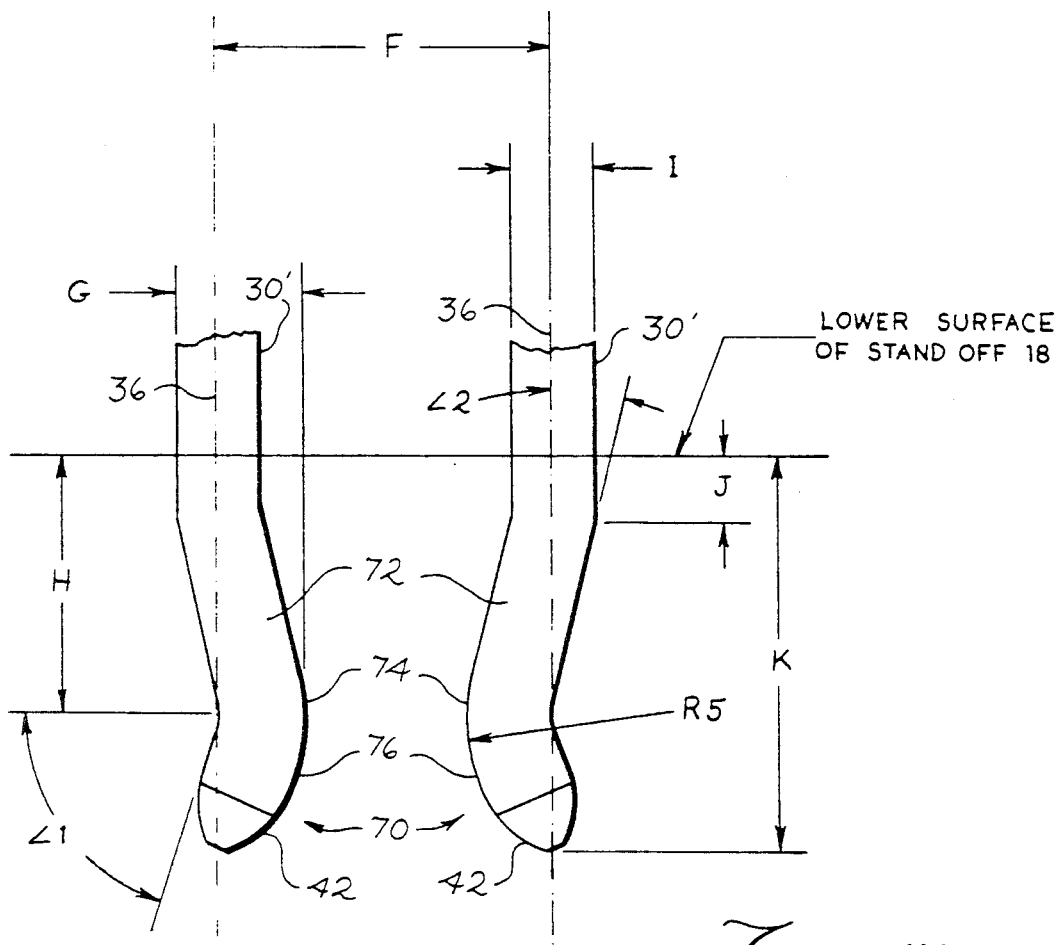
FIG. 13 is an end view showing the configuration of the posts at one of the ends of the connector of FIG. 1.
Figure 14:
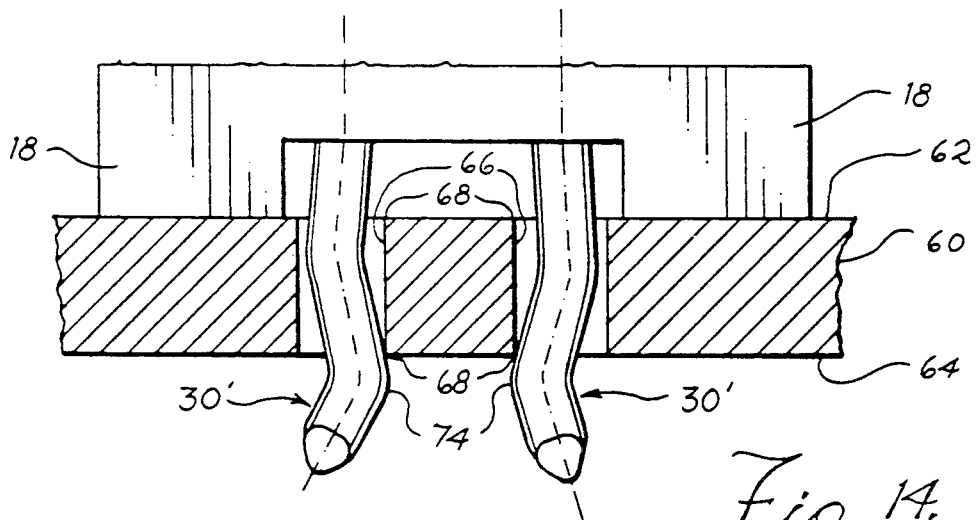
FIG. 14 is a cross sectional view showing the posts of FIG. 14 engaged with a printed circuit board prior to soldering.

Once the electrical connector 10 has been assembled by press fitting the posts 30 into the body 12, a retention feature can be added to selected ones of the posts 30 to retain the electrical connector 10 temporarily in place in a circuit board prior to soldering. FIG. 13 shows an enlarged end view of the connector 10 and two of the corner posts 30'. FIG. 14 shows a cross-sectional view of the electrical connector 10 mounted in a circuit board 60 prior to soldering. The circuit board 60 defines top and bottom surfaces 62, 64 and through holes 66 extending therebetween. The through holes 66 are generally cylindrical, and the intersection region between the through holes 66 and the surfaces 62, 64 defines corners 68.

As shown in FIG. 13, at least one and preferably pairs of the posts 30' are bent to provide a retention feature 70. The bent portion of each of the posts 30' defines a first portion 72 which diverges away from the centerline 36 to an apex 74. The bent post also defines a second portion 76 which extends from the apex 74 to the tip 42. As shown in FIG. 12, the first and second portions 72, 76 are configured such that the apex 74 is positioned to one side of the centerline 36, but the tip 42 is positioned on the centerline 36. The radiused post edges 40 provide rounded contacting surfaces that contact the corners 68 as the retention feature 70 is inserted into the through hole 66. When the connector 10 is installed on the circuit board 60 (FIG. 14), the apexes 74 are positioned below the bottom surface 64. In this way, each of the retention features 70 creates a latching force tending to pull the electrical connector 10 into contact with the top surface 62.

Because the retention features 70 function below the board to latch the electrical connector 10 in place, an audible click may be heard when the electrical connector 10 is seated on the circuit board 60. Some users regard this latching type retention feature as more stable than retention features which rely solely on friction within the through hole 66. The retention feature 70 has surprisingly been found to function properly with circuit board through holes 66 having a wide range of diameters, without unacceptable damage to the tin plating that is typically present in the through hole. This surprising result is believed to be directly attributable to the cooperation between the geometry of the first and second portions 72, 76 and the geometry of the radiused post edges 40. The resulting retention feature reduces damage to the through hole plating and functions without any undesirable increase in the length of the post 30' extending below the bottom surface 64 of the circuit board 60.

The retention feature 70 can be used both with straight headers as shown and right angle headers (not shown). Furthermore, the retention feature 70 can be used on single posts or on pairs of posts as shown in which the apex is 74 offset with respect to the centerline 36. Depending upon the application, the apexes 74 may be offset toward one another, away from one another, or at some angle with respect to one another. Furthermore, the retention feature 70 is well suited for use in headers having one, two, or three or more rows of posts 30.

Simply by way of example, the following details of construction have been found suitable in one application. Of course, these details are not intended to limit the scope of this invention, because other applications will often require other specific geometries or materials.

With respect to materials, the posts 30, 30' may be formed from drawn, radiused phosphor bronze wire such as UNS C51000, Temper 3H. The body 12 may be molded of any suitable material such as a glass filled nylon or a liquid crystal polymer.

With respect to dimensions, Table 1 provides presently preferred dimensions, using reference symbols defined in FIGS. 5, 6, 8 and 13.

TABLE 1

| Reference Symbol (Figures) | Dimension (inches) Or Angle (degrees) |
| --- | --- |
| A | 0.023 |
| B | 0.018 |
| C | 0.0095 |
| D | 0.0245 |
| E | 0.0245 |
| F | 0.100 |
| G | 0.038 |
| H | 0.077 |
| I | 0.0245 |
| J | 0.020 |
| K | 0.117 |
| $L_1$ | 70° 46' |
| $L_2$ | 13° 35' |
| $R_1$ | 0.130 |
| $R_2$ | 0.007 |
| $R_3$ | 0.037 |
| $R_4$ | 0.006 |
| $R_5$ | 0.055 |

Note that the length of the tip A is less than the maximum face to face dimension D, E.

The round portion 22 in this preferred embodiment has a diameter of 0.0277 inches, and the out-of-round portion 24 in this preferred embodiment defines a maximum diagonal dimension of 0.0277 inches, and a maximum dimension between opposed faces 26 of 0.0235 inches. The posts 30, 30' define a maximum diagonal dimension of 0.0292 inches. These dimensions have been found to provide excellent post retention without excessive post insertion forces or excessive stresses to the body 12.

Figure 5:
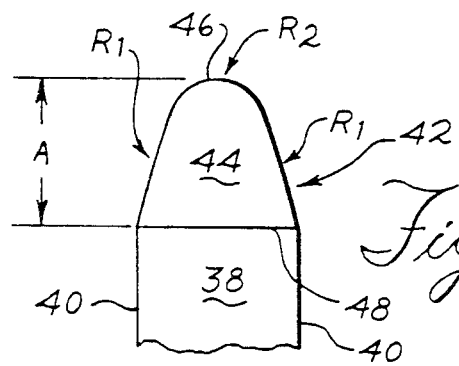
FIG. 5 is an enlarged view of the encircled region 5 of FIG. 4.
Figure 8:
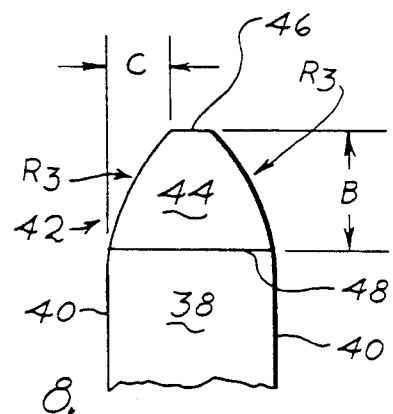
FIG. 8 is an enlarged view of the encircled region 8 of FIG. 7.

Preferably, the tip 42 is formed in a multi-step operation which combines coining and shearing operations, using vertically moving dies. In the first step an upper one of the tip faces 44 is coined downwardly. This pushes excess metal laterally. Then the two side tip faces 44 shown in profile in FIG. 5 are sheared into the desired convex shape. Finally, the upper and lower tip faces shown in profile in FIG. 8 are coined (the upper tip face for the second time and the lower tip face for the first time) to the final convex shape. This approach provides the desired tip geometry while requiring only dies that move vertically.

The first ends 32 are typically tin plated to facilitate soldering, and the second ends 34 are typically gold plated to facilitate mating operations. However, plating details for the first and second ends do not form part of this invention, and are therefore not described in greater detail here.

This preferred embodiment has been designed for use with through holes 66 having a diameter of 0.040±0.003 inches in a circuit board 60 having a thickness of 0.062±0.007 inches. Throughout these tolerance ranges the connector 10 can be inserted with an insertion force of no more than 10 pounds, and adequate retention forces are obtained. Surprisingly, this has been achieved with stiff posts of the type described above, without damage to the tin plating at the corners 68.

The present invention may readily be adapted to square posts of other dimensions and to rectangular posts. Other forming techniques such as rolling and cutting operations may be used to form the tip, and the radiused post edges may be compressively or otherwise formed only in desired regions of the post.

I claim:

1. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, wherein the connector is mounted on a circuit board comprising a pair of spaced, parallel surfaces and a plurality of through holes extending therebetween and intersecting the surfaces at corners, and wherein each of the posts is received in a respective one of the through holes, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent than is the tip;

said retention feature configured such that the apex is situated outside of the respective through hole, and the first portion contacts the circuit board at the respective corner between the through hole and the surface opposite the connector body;

said first portion defining at least one contacting surface positioned to contact the circuit board at the respective corner between the through hole and the surface adjacent the connector body as the post is inserted into the respective through hole;

said contacting surface formed at an intersection of two adjacent ones of the flat faces and having a radius of curvature no less than about one fifth of the maximum face to face cross-sectional dimension of the post.

2. The invention of claim 1 wherein said at least one retention feature comprises at least one pair of retention features, and wherein the apexes of the pair are laterally offset in opposite directions with respect to the respective centerlines.

3. The invention of claim 1 wherein the posts are stiff.

4. The invention of claim 1 wherein the tip is tapered and defines a smooth transition between the tip and the at least one contacting surface.

5. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, wherein the connector is mounted on a circuit board comprising a pair of spaced, parallel surfaces and a plurality of through holes extending therebetween and intersecting the surfaces at corners, and wherein each of the posts is received in a respective one of the through holes, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent than is the tip;

said retention feature configured such that the apex is situated outside of the respective through hole, and the first portion contacts the circuit board at the respective corner between the through hole and the surface opposite the connector body;

said first portion defining at least one contacting surface positioned to contact the circuit board at the respective corner between the through hole and the surface adjacent the connector body as the post is inserted into the respective through hole;

said contacting surface having a radius of curvature no less than about one fifth of the maximum face to face cross-sectional dimension of the post;

wherein said at least one retention feature comprises at least one pair of retention features, and wherein the apexes of the pair are laterally offset in opposite directions with respect to the respective centerlines;

wherein the apexes of the pair are laterally offset each toward the other.

6. The invention of claim 1 wherein the opposed faces in each pair are separated by about 0.025 inches such that the maximum face to face cross-sectional dimension is about 0.025 inches.

7. The invention of claim 6 wherein the radius of curvature is about 0.006 inches.

8. The invention of claim 7 wherein the tip is positioned on the centerline.

9. The invention of claim 1 wherein the post on which the retention feature is formed comprises a drawn wire having four faces that intersect at radiused edges, wherein each of the radiused edges defines a radius of curvature no less than about one fifth of the maximum face to face cross-sectional dimension of the post.

10. The invention of claim 9 wherein the tip defines four tip faces which converge toward a tip nose, and wherein each of the tip faces is convex outwardly.

11. The invention of claim 10 wherein the post faces are arranged in opposed pairs separated by about 0.025 inches, and wherein the radiused edges each define a radius of curvature no less than about 0.005 inches.

12. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, wherein the connector is mounted on a circuit board comprising a pair of spaced, parallel surfaces and a plurality of through holes extending therebetween and intersecting the surfaces at corners, and wherein each of the posts is received in a respective one of the through holes, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent that is the tip;

said retention feature configured such that the apex is situated outside of the respective through hole, and the first portion contacts the circuit board at the respective corner between the through hole and the surface opposite the connector body;

said first portion defining at least one contacting surface positioned to contact the circuit board at the respective corner between the through hole and the surface adjacent the connector body as the post is inserted into the respective through hole;

said contacting surface having a radius of curvature no less than about one fifth of the maximum face to face cross-sectional dimension of the post;

wherein the tip is tapered and defines a smooth transition between the tip and the at least one contacting surface;

wherein the tip defines at least one convex tip face that tapers from the contacting surface toward a nose included in the tip.

13. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent that is the tip;

said first portion defining at least one contacting surface positioned to contact the circuit board at the respective corner between the through hole and the surface adjacent the connector body as the post is inserted into the respective through hole;

said contacting surface formed at an intersection of two adjacent ones of the flat faces having a radius of curvature no less than about one fifth of the maximum face to face cross-sectional dimension of the post.

14. The invention of claim 13 wherein said at least one retention feature comprises at least one pair of retention features, and wherein the apexes of the pair are laterally offset in opposite directions with respect to the respective centerlines.

15. The invention of claim 13 wherein the tip is positioned on the centerline.

16. The invention of claim 13 wherein the posts are stiff.

17. The invention of claim 13 wherein the tip is tapered and defines a smooth transition between the tip and the at least one contacting surface.

18. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent than is the tip;

said first portion defining at least one contacting surface positioned to contact the circuit board at the respective corner between the through hole and the surface adjacent the connector body as the post is inserted into the respective through hole;

said contacting surface having a radius of curvature no less than about one fifth of the maximum face to face cross-sectional dimension of the post;

wherein said at least one retention feature comprises at least one pair of retention features, and wherein the apexes of the pair are laterally offset in opposite directions with respect to the respective centerlines;

wherein the apexes of the pair are laterally offset each toward the other.

19. The invention of claim 13 wherein the opposed faces in each pair are separated by about 0.025 inches such that the maximum face to face cross-sectional dimension is about 0.025 inches.

20. The invention of claim 19 wherein the radius of curvature is about 0.006 inches.

21. The invention of claim 13 wherein the post on which the retention feature is formed comprises a drawn wire having four faces that intersect at radiused edges, wherein each of the radiused edges defines a radius of curvature no less than about one fifth of the maximum face to face cross-sectional dimension of the post.

22. The invention of claim 21 wherein the tip defines four tip faces which converge toward a tip nose, and wherein each of the tip faces is convex outwardly.

23. The invention of claim 22 wherein the post faces are arranged in opposed pairs separated by about 0.025 inches, and wherein the radiused edges each define a radius of curvature no less than about 0.005 inches.

24. In an electrical connector of the type comprising a connector body and a plurality of posts extending out of one side of the connector body for mounting to a circuit board, each of said posts defining a tip, a centerline, two pairs of opposed flat faces, and a maximum face to face cross-sectional dimension, the improvement comprising:

at least one retention feature, each formed on a selected one of the posts, said retention feature comprising a bent portion of the post comprising a first portion extending from the centerline to an apex, and a second portion extending from the apex to the tip, such that the apex is laterally offset from the centerline to a greater extent than is the tip;

said first portion defining at least one contacting surface positioned to contact the circuit board at the respective corner between the through hole and the surface adjacent the connector body as the post is inserted into the respective through hole;

said contacting surface having a radius of curvature no less than about one fifth of the maximum face to face cross-sectional dimension of the post;

wherein the tip is tapered and defines a smooth transition between the tip and the at least one contacting surface;

wherein the tip defines at least one convex tip face that tapers from the contacting surface toward a nose included in the tip.

* * * * *